United States Patent
Greulich-Weber et al.

(10) Patent No.: US 10,854,833 B2
(45) Date of Patent: Dec. 1, 2020

(54) PHOTOVOLTAIC DEVICE

(75) Inventors: Siegmund Greulich-Weber, Bad Lippspringe (DE); Bettina Friedel, Paderborn (DE); Marc Zoeller, Paderborn (DE)

(73) Assignee: UNIVERSITAET PADERBORN, Paderborn (DE)

( * ) Notice: Subject to any disclaimer, the term of this patent is extended or adjusted under 35 U.S.C. 154(b) by 229 days.

(21) Appl. No.: 12/311,441

(22) PCT Filed: Oct. 1, 2007

(86) PCT No.: PCT/DE2007/001772
§ 371 (c)(1),
(2), (4) Date: Jun. 4, 2009

(87) PCT Pub. No.: WO2008/040333
PCT Pub. Date: Apr. 10, 2008

(65) Prior Publication Data
US 2010/0000599 A1 Jan. 7, 2010

(30) Foreign Application Priority Data
Oct. 2, 2006 (DE) .......................... 10 2006 047 045

(51) Int. Cl.
  *H01L 51/42* (2006.01)
  *H01L 51/00* (2006.01)
(52) U.S. Cl.
  CPC ........ *H01L 51/424* (2013.01); *H01L 51/0036* (2013.01); *Y02E 10/549* (2013.01); *Y10T 156/10* (2015.01)
(58) Field of Classification Search
  CPC ........................ H01L 27/304; H01L 51/4266
  (Continued)

(56) References Cited

U.S. PATENT DOCUMENTS 4,106,951 A * 8/1978 Masi ..................... H01L 31/072
                                                                136/263
4,781,766 A * 11/1988 Barnett et al. ................ 136/258
(Continued)

FOREIGN PATENT DOCUMENTS

EP    1 369 923    12/2003
FR    2 856 197    12/2004
(Continued)

OTHER PUBLICATIONS

H. Kim, J Y Kim, K. Lee, Y. Park, Y. Jin, H. Suh, "Organic photovoltaic cells based in conjugated polymer/fullerene composites", Current Applied Physics, 2001, p. 139-143.*
(Continued)

*Primary Examiner* — Magali P Slawski
(74) *Attorney, Agent, or Firm* — Collard & Roe, P.C.

(57) ABSTRACT

The invention relates to a photovoltaic device (1), comprising a photovoltaic acceptor material (7) and a photovoltaic donor material (10), in which the photovoltaic device (1) comprises at least two carrier layers (2, 3), of which one carrier layer (2) has n-doped electron donors (6) and the other carrier layer has acceptor material (7) as p-doped or undoped electron acceptors, wherein the carrier layers (2, 3) are arranged with respect to one another such that they touch one another at least in sections, and the carrier layers (2, 3) are wetted or coated in filmlike fashion with a photovoltaic donor material (10). The carrier layers (2, 3), which are formed in particular from fibres (6, 7) composed of silicon carbide SiC, enable textile solar cells. Methods for producing the fibres (6, 7) and for producing the photovoltaic device (1) and textile structures formed therefrom are furthermore described. A photovoltaic device (1) is furthermore proposed, in which carrier elements of an individual carrier
(Continued)

layer have a corresponding photovoltaically active construction by virtue of correspondingly applied layers.

18 Claims, 8 Drawing Sheets

(58) Field of Classification Search
USPC .......................................................... 136/255
See application file for complete search history.

(56) References Cited

U.S. PATENT DOCUMENTS

| | | | | |
|---|---|---|---|---|
| 4,913,744 | A * | 4/1990 | Hoegl et al. ................... | 136/244 |
| 5,284,525 | A * | 2/1994 | Saito ................... | H01L 31/0236 |
| | | | | 136/256 |
| 5,578,901 | A * | 11/1996 | Blanchet-Fincher ... | H01J 1/304 |
| | | | | 313/309 |
| 6,121,540 | A * | 9/2000 | Takeda et al. ................. | 136/244 |
| 6,660,419 | B1 * | 12/2003 | Nishida ............... | H01M 8/0206 |
| | | | | 429/210 |
| 7,063,994 | B2 | 6/2006 | Xiao et al. | |
| 2002/0187571 | A1 * | 12/2002 | Collins, III ............ | C25D 13/02 |
| | | | | 438/29 |
| 2004/0118448 | A1 * | 6/2004 | Scher ..................... | B82Y 10/00 |
| | | | | 136/252 |
| 2005/0040374 | A1 * | 2/2005 | Chittibabu et al. ........ | 252/501.1 |
| 2005/0271796 | A1 * | 12/2005 | Neudecker et al. ............ | 427/58 |
| 2005/0285121 | A1 * | 12/2005 | Kim, II ........................... | 257/79 |
| 2006/0013549 | A1 * | 1/2006 | Shtein et al. ................. | 385/128 |
| 2006/0207647 | A1 * | 9/2006 | Tsakalakos et al. .......... | 136/256 |
| 2010/0055824 | A1 * | 3/2010 | Lin et al. ........................ | 438/73 |
| 2010/0294350 | A1 * | 11/2010 | Ko ....................... | H01G 9/2031 |
| | | | | 136/255 |
| 2014/0130850 | A1 * | 5/2014 | Nicolet ................... | C08L 53/02 |
| | | | | 136/251 |

FOREIGN PATENT DOCUMENTS

| | | |
|---|---|---|
| JP | 06-283733 | 10/1994 |
| WO | WO 2004/112164 | 12/2004 |

OTHER PUBLICATIONS

MDMO-PPV from http://ww w.sigmaaldrich.com /catalog/product/aldrich/546461?lang=en&region=US.*
International Search Report.
Meng et al., "Synthesis of "A beta-siC nanorod within a SiO2 nanorod" one dimensional composite nanostructures," Solid State communications, vol. 106, No. 4, Apr. 1998, pp. 215-219. XP-002492009 (ISR).
English Translation of the International Preliminary Report on Patentability and Written Opinion of the International Searching Authority.
Specialty Materials, Inc. SCS Silicon Carbide Fiber product explanation from http://www.specmaterials.com/siliconcarbidefiber.htm and Carbon Monofilament product explanation from http://www.specmaterials.corn/carbonmonofilament.htm downloaded on Feb. 1, 2013.
Printout Article "Surface Magnetism: Relativistic Effects at Semiconductor Interfaces and Solar Cells", Springer-Verlag Berlin Heidelberg 2013 (15 pages).
Photoinduced electron transfer from conjugated polymers to CdSe nanocrystals, D. S. Ginger and N. C. Greenham, Phys Rev B 59, 10622, Published Apr. 15, 1999 (Abstract only).
CdSe Nanocrystal Rods/Poly (3-hexylthiophene) Composite Photovoltaic Devices, Wendy U. Huynh, Xiaogang Peng, and A. Paul Alivisatos, Advanced Materials, vol. 11, Issue 11, Aug. 5, 1999 (Abstract only).
Photoinduced electron transfer from conjugated polymers to CdSe nanocrystals, D. S. Ginger and N.C. Greenham, Physical Review B (Condensed Matter and Materials Physics), vol. 59, Issue 16, Apr. 15, 1999 (Abstract only).
Charge separation in conjugated-polymer/nanocrystal blends, D. S. Ginger and N. C. Greenham. Synthetic Metals, vol. 101, Issues 1-3, May 1999 (Abstract only).
ISO/TS 80004-6:2013(en), Nanotechnologies—Vocabulary—Part 6: Nano-object characterization, https://www.iso.org/obp/ui/#iso:std:iso:ts:80004:-6:ed-1:v1:en, 1 page, retrieved Oct. 21, 2019.
ISO/TS 80004-2:2015(en), Nanotechnologies—Vocabulary—Part 2: Nano-objects, https://www.iso.org/obp/ui/#iso:std:iso:ts:80004:-2:ed-1:v1:en term.4.9, 1 page, retrieved Oct. 21, 2019.
ISO 20507:2014(en), Fine ceramics (advanced ceramics, advanced technical ceramics)—Vocabulary, https://www.iso.org/obp/ui/#iso:std:iso:20507:ed-2:v1:en, 1 page, retrieved Oct. 21, 2019.
ISO 20507:2014(en), Fine ceramics (advanced ceramics, advanced technical ceramics)—Vocabulary, https://www.iso.org/obp/ui/#iso:std:iso:20507:ed-2:v1:en:sec:2.2.9, 1 page, retrieved Oct. 21, 2019.
ISO 4407:2002(en), Hydraulic fluid power—Fluid contamination—Determination of particulate contamination by the counting method using an optical microscope, https://www.iso.org/obp/ui/#iso:std:iso:4407:ed-2:v1:en, 1 page, retrieved Oct. 21, 2019.
ISO 10312:2019(en), Ambient air—Determination of asbestos fibres—Direct transfer transmission electron microscopy method, https://www.iso.org/obp/ui/#iso:std:iso:10312:ed-2:v1:en, 1 page, retrieved Oct. 21, 2019.

* cited by examiner

PHOTOVOLTAIC DEVICE

CROSS REFERENCE TO RELATED APPLICATIONS

This application is the National Stage of PCT/DE2007/001772 filed on Oct. 1, 2007, which claims priority under 35 U.S.C. § 119 of German Application No. 10 2006 047 045.1 filed Oct. 2, 2006. The international application under PCT article 21(2) was not published in English.

The invention relates to photovoltaic devices, as well as to a method for the production of fibers for carrier layers for forming a photovoltaic device, and a method for the production of a layer structure, and to a textile material.

In the production of solar energy by means of photovoltaic elements, the technology that can be used nowadays is generally based on the use of photovoltaic elements on the basis of silicon, which are used in the form of rigid panels. In this connection, such panels are generally formed from a number of individual cells composed of monocrystals, which are produced by means of conventional methods of silicon technology, and wired together with one another in a circuit, so that the charges formed in each individual cell are added up. It is problematic in this connection that the individual photovoltaic elements of such a panel are rigid, because of the properties of the silicon, and therefore it is difficult to adapt them to conditions that already exist on the construction side.

One possibility for circumventing the disadvantages of silicon, also on the basis of its mechanical properties, can be seen in the use of organic or polymer solar cells. Photovoltaic effects in organic photoconductive materials have already been known for several decades, but despite the lower production costs, it has hardly been possible to push them through, up to the present time, against the conventional silicon solar cells. For the past few years, however, photoactive polymers have increasingly been used for the production of shape-flexible solar cells. The functional principle of the polymer solar cells is based on the formation of excitons (electron-hole pairs) in what are called conjugated polymers (plastics from the groups of polyphenylenes, polyvinyl phenylenes, polythiophenes, or polyanilines), by means of the absorption of light. Because of the strong bond of the electron with the polymer, the exciton has a relatively small diffusion length (distance of the electron from the hole that remains on the polymer chain) of about 100 nm, and recombines relatively rapidly. However, because as long as possible a useful lifetime of the photo-induced state is advantageous for photovoltaic applications, an acceptor material is required that is supposed to capture these electrons in the diffusion area of the exciton, and thus prevent them from recombining. In known implementations, this is achieved by means of a composite material composed of conjugated polymers and fullerene derivatives, such as P3HT:PCBM or MDMO-PPV:PCBM, for example; in this connection, a transfer of the electron from the polymer to the fullerene takes place, and the hole remains on the polymer chain. A usual polymer solar cell is composed of multiple layers: a transparent carrier layer, a transparent cathode (usually ITO), the photoactive composite layer, usually an additional p-conductive layer (in order to derive the holes from the polymer chain), and a reflective anode (usually aluminum). Because of the complicated structure of such polymer solar cells, part of the possible advantages and properties on the material side is lost again; in particular, the mechanical flexibility and strength, and the degree of effectiveness, are not satisfactory.

It is therefore the task of the present invention to further develop a polymer solar cell of the type indicated, in such a manner that it demonstrates increased mechanical flexibility, while having the same or an increased ability to withstand mechanical stress.

The solution for the task according to the invention is evident from the features described herein. Further advantageous embodiments are also described herein.

The invention according to a first embodiment proceeds from a photovoltaic device having a photovoltaic acceptor material and a photovoltaic donor material. Such a photovoltaic device is developed further, in a manner according to the invention, in that the photovoltaic device has at least two carrier layers, of which one carrier layer has n-doped electron donors, and the other carrier layer has acceptor material as p-doped or undoped electron acceptors, whereby the carrier layers are disposed, relative to one another, so as to touch one another, at least in sections, and the carrier layers are wetted or coated with a photovoltaic donor material, in film-like manner. In this way, a photovoltaic device is obtained, which functions in a manner similar to a polymer solar cell, but has special advantages as a result of the possible embodiments that will be indicated below. The fundamental idea consists in producing a two-layer structure of the photovoltaic device, composed of differently doped carrier layers (n-conductive and p-conductive, respectively), and of saturating or wetting these with photoactive polymers (e.g. P3HT, MDMO-PPV, MEH-PPV, or PFB). Wetting a layer structure as mentioned above with a conjugated polymer results in the advantage that because of the p-doping and n-doping, respectively, of the carrier layers, these already participate in the photovoltaic process as electron acceptors and electron donors, respectively. Carrier layers composed of p-doped and of n-doped materials are laid directly on top of one another, and wetted or saturated with a donor material such as a conjugated polymer. If an exciton is formed in the donor material when it is irradiated with light, the electron transfer takes place, in this case, directly from the polymer into the (p-doped) acceptor material, and in the same way, holes are given off by the polymer chain to the donor fibers (n-doped). No further coatings or carrier materials are required.

In a first preferred embodiment, the carrier layers can be formed from fibers disposed in layer-like manner, whereby one carrier layer only has fibers as p-doped or undoped electron acceptors, and the other carrier layer only has fibers as n-doped electron donors. Such a configuration of the carrier layers composed of fibers offers the possibility of introducing the mechanical flexibility and deformability of these fibers into a woven fabric formed from the fibers, for example, or into a nonwoven fabric, in that the fibers are processed into such a textile material or form this textile material, after having been produced. In this way, a kind of photovoltaic woven fabric is obtained, which functions in a manner similar to a solar cell, but furthermore is significantly more flexible, more robust, and, above all, can be processed in the manner of a textile. In this connection, the photovoltaically active surface is also significantly increased, and the effectiveness of the photovoltaic device is improved. Such a photovoltaic woven fabric, which produces current when irradiated by the sun, but is completely flexible, very robust, ultralight, and can be processed like textiles, can be used in many areas, such as for functional clothing, for sail cloth, on aircraft support surfaces, sun umbrellas, etc.

In a further embodiment, the carrier layers composed of fibers are disposed so as to touch one another, at least in sections, whereby the carrier layers are wetted with a donor material, or the fibers of each carrier layer are coated with the donor material, and in this way, the fibers of the p-doped or undoped carrier layer form photovoltaic elements at their contact points with the donor material. Because of the coating, the donor material essentially forms a photovoltaic element on the entire surface of the carrier layers or of the fibers at which the donor material and the p-doped or undoped carrier layers or fibers touch one another, and as a result, due to the large surface of the carrier layer or the fibers, the photoelectrically active surface of a photovoltaic device formed in this manner is significantly increased as compared with conventional photovoltaic devices.

The invention in a further embodiment proceeds from a photovoltaic device, having a photovoltaic acceptor material and a photovoltaic donor material. Such a photovoltaic device is developed further, in a manner according to the invention, in that the photovoltaic device has a carrier layer composed of a number of carrier elements that extend longitudinally, in fiber-like manner, consisting of the acceptor material, preferably of a p-doped or undoped electron acceptor, and the carrier elements of the carrier layer are wetted or coated with the photovoltaic donor material, in film-like manner, onto which another layer composed of a preferably n-doped electron donor is applied. In this connection, the layer structure of the previously-described photovoltaic device, which consists of two layers, is essentially implemented in a single layer composed of a number of carrier elements that extend longitudinally, in fiber-like manner, whereby each carrier element in itself can be sheathed with two different layers having a defined thickness, and thus the innermost layer of the acceptor material, and the outermost layer of the electron donor, separated by the layer composed of the photovoltaic donor material, form the layer structure that can be utilized to produce photovoltaic current. As a result of the layer thicknesses, which can be adjusted more precisely than in the case of the previously-described embodiment and which are independent of the location of the two carrier layers relative to one another, as in the case of the previously-described embodiment, optimal distances of the layer composed of the acceptor material from the layer composed of the electron donor are obtained, in each instance, and thus it will be possible to achieve a higher degree of effectiveness.

For this purpose, in a first embodiment, the carrier elements that extend longitudinally, in fiber-like manner, can be disposed in structured manner relative to one another, for example as a mat having intersecting fibers. Of course, other arrangement forms of the carrier elements are also possible, for example irregularly shaped interlaid scrims, or woven fabrics, or the like.

It is advantageous if the carrier elements of the carrier layer are formed from silicon carbide SiC, preferably doped with aluminum, and furthermore, the layer of the photovoltaic donor material completely sheathes the carrier elements of the carrier layer. In this way, the distance between the carrier elements of the carrier layer and the layer composed of the n-doped electron donor, on a suitable acceptor material having the properties that will still be described below, can be adjusted in such a manner, by varying the layer thickness of the layer composed of the photovoltaic donor material, that the degree of effectiveness of the photovoltaic device can be optimized as a function of the material used, in each instance. In this connection, it is advantageous if the layer composed of the photovoltaic donor material has a thickness of 100 nm.

In a further embodiment, it is possible that the layer composed of an n-doped electron donor, on the layer composed of the photovoltaic donor material, consists of a transparent organic electrode material. Such a transparent organic electrode material will generally be a translucent or at least photoconductive polymer electrode material, preferably composed of polyethylene dioxythiophene such as Baytron, which is applied to the layer composed of the photovoltaic donor material. This can take place, for example, from a suspension, for example by means of spin-coating, dip-coating, or also by being sprayed on.

For the second main embodiment of the photovoltaic device, essentially the same properties and advantages exist, which will still be explained in greater detail below, also for the first embodiment of the photovoltaic device.

It is furthermore advantageous that the fibers of the carrier layers composed of fibers can be processed in textile manner. As a result, all the processing methods known from the sector of textile materials are available for further processing of the fibers to produce the carrier layer, and a plurality of different textile materials, having different properties, which can be adapted to the purpose of use, in each instance, can be formed by means of carrier layers produced in this manner. For example, it is possible that in a first embodiment, the carrier layer is formed from fibers in the form of short fibers disposed in the manner of a nonwoven fabric, particularly from fibers having a maximal length of 5 mm. Such nonwoven fabrics represent loose connections between the fibers, which are disposed in more or less unstructured manner relative to one another, and form light layers, whose strength properties, for example, can be varied within a very broad range. In another embodiment, it is also possible that the carrier layer is formed from fibers in the form of long fibers that have been woven together with one another, particularly from fibers having a length of more than 5 mm. In this way, the entire sector of woven fibers, or fibers otherwise firmly connected with one another, in textile manner, is opened up for the photovoltaic device; these can have greater strengths as the result of the orientation of the fibers relative to one another, and the plurality of connections of the fibers with one another. Furthermore, the carrier layer can also be formed from fibers in the form of short or long fibers that are interlinked with one another, for example in that the fibers are chemically of thermally interlinked with one another or fixed in place on one another at their contact points, as the result of later treatment steps, and thus form a composite that can be deformed well, but is stable in and of itself.

It is advantageous if, in a further embodiment, the diameters of the fibers of the carrier layers amount to between 20 nm up to 100 μm. In this way, the strength and the deformability of the fibers can be controlled within broad limits, along with the inherent strength of the fibers on the basis of their material, and thus the strength properties of woven fabrics produced from them can be influenced accordingly.

In another embodiment, it is also possible that the carrier layers consist of a thin homogeneous layer of the n-doped electron donor and a thin homogeneous layer of the p-doped or undoped electron acceptor. It is true that such homogeneous layers, configured approximately in film-like manner, do not demonstrate the advantages of textile structures formed from fibers, but also have a certain deformability. To increase their strength, the thin homogeneous layers can be applied to a carrier material that can withstand mechanical stress, which material itself has higher strength values than the thin homogeneous layers.

In an alternative embodiment, it is also possible that the carrier layers consist of a thin porous structure of the n-doped electron donor and a thin porous structure of the p-doped or undoped electron acceptor. A porous structure also offers the possibility of combining a certain mechanical flexibility with the advantageous properties of the layer structure described.

It is advantageous for the use of the photovoltaic device that contacting of the layers of the layer structure, for conducting away the charges produced, can take place at any desired location of the layers. In this way, it is possible, for example in the case of a woven fabric such as an awning or the like, to implement contacting at a suitable location, without disadvantages being brought about by the contacting, with regard to use of the textile woven fabric. It is advantageous, for example, if contacting of the layers formed from fibers takes place at seams of textile materials formed from the layers, at which corresponding processing steps have to be performed in any case.

Furthermore, it is possible that electronic components are integrated into the layers, which can take over special tasks in the production of the electrical voltage of the photovoltaic device, for example.

With regard to the materials for the electron acceptor and the electron donor, the most varied materials can be used. It is advantageous if transparent semiconductor materials, particularly organic or inorganic semiconductor materials, preferably ZnO, $TiO_2$, can be used as the material for the p-doped or undoped electron acceptor.

It has proven to be particularly advantageous if silicon carbide SiC is used as the material for the carrier layer having the p-doped or undoped electron acceptor. In a further embodiment, the silicon carbide SiC can also be used as the material for the carrier layer having the n-doped electron donor. In this connection, it is also possible to use the silicon carbide SiC as a silicon carbide monocrystal, preferably as a monocrystalline cubic 3C-SiC. The monocrystalline silicon carbide fibers, in particular, combine the excellent properties of the mineral, such as great hardness, optical transparency, semiconductor nature, great thermal conductivity, chemical and thermal stability, among others, with the flexibility of the fibers as required for production of a woven fabric. Silicon carbide woven fabrics can also be used for protective clothing (against stabbing, cutting, and shooting injuries), protective coverings and sheaths, in many sectors. Wetting a woven fabric composed of silicon fibers with a conjugated polymer brings multiple advantages with it. For one thing, an SiC woven fabric represents a very flexible and durable carrier material; for another, because of the p-doping or n-doping of the fibers, respectively, it already participates in the photovoltaic process as an electron acceptor or donor, respectively. Woven fabrics composed of p-doped and of n-doped SiC fibers are laid directly on top of one another and wetted/saturated with a conjugated polymer. If an exciton is formed when irradiation with light occurs, the electron transfer takes place, in this case, directly from the polymer into the p-doped acceptor fibers, and in the same way, the holes are given off by the polymer chain to the n-doped or undoped donor fibers. A light, easy to process, current-producing woven fabric is obtained, which can be used as coverings for awnings, blinds, sun umbrellas, clothing, curtains, cover tarps, aircraft support surfaces, and much more. Such a silicon carbide woven fabric in itself is also suitable for protective clothing (against stabbing, cutting, and shooting injuries), protective coverings or sheaths, in many sectors. In addition to the excellent electronic properties of silicon carbide, this material has other advantages, such as great chemical and thermal stability. It is the hardest material after diamond, and possesses great thermal conductivity. It can therefore also withstand great mechanical stress, or can be used in an aggressive or high-temperature environment.

When using silicon carbide 3C-SiC as a material for the fibers composed of monocrystalline silicon carbide SiC, the fibers are formed with a complete cross-section and a hexagonal circumference shape. In this way, very stable fiber formation is guaranteed.

It is also possible that the silicon carbide SiC can be used as porous silicon carbide or as polycrystalline silicon carbide.

In another embodiment, it is possible that transparent conductor materials, preferably ITO, ATO, AZO, or similar conductor materials, are used as a material for the carrier layer having the n-doped electron donor.

It is particularly advantageous if the photovoltaic donor material is a conjugated polymer. Such conjugated polymers, for example P3HT (poly-(3-hexyl thiophene)), MDMO-PPV (poly(2-methoxy-5-(3',7'-dimethyl octyloxy)-1,4-phenylene vinylene)), MEH-PPV (poly(2,5-dialkoxy-para-phenylene vinylene)), and PFB (poly(9,9'-dioctyl fluorine-co-bis-N,N'-(4-butyl phenyl)-bis-N,N'-phenyl-1,4-phenylene diamine)), have advantageous photoelectric properties and are known, and for this reason can be technically managed, to a great extent. In this connection, it is particularly important that the photovoltaic donor material is configured as a donor material that can be applied to the carrier layer as a film. The photoelectric properties can be controlled and influenced, to a great extent, by means of the film formation on the carrier layers or on the fibers of the carrier layers.

The invention furthermore relates to a method for the production of fibers for carrier layers for forming a photovoltaic device, particularly a photovoltaic device according to the first described embodiment, in which method, in a first step, the materials to be processed form a mixture in the form of a gel with one another, during a sol-gel synthesis, and in a further step, growing of the fibers takes place in a carbothermal reduction. The known sol-gel process offers a manageable and broadly variable possibility for the production of the most varied starting materials for the production of the carrier layers according to the invention, or for their precursor materials. In this connection, the sol-gel synthesis takes place, in a further embodiment, using tetraethyl orthosilicate, ethanol, hydrochloric acid, and saccharose.

It is advantageous if the doping materials are introduced in the wet chemistry part of the sol-gel synthesis, thereby making it possible to build the doping materials into the growing fibers during the thermal treatment. In this connection, the doping materials can either be added as a soluble compound, or can be added metallically. Alternatively, however, it is also possible that the doping of the forming fibers is carried out during the thermal treatment, by way of the gas phase. Preferably, phosphorus P, nitrogen N, boron B, and/or aluminum Al, or their compounds, can be used as doping materials.

With regard to influencing the method and its products when using silicon carbide SiC, it is advantageous that the temperature set during thermal treatment influences the method of crystallization of the fibers of the silicon carbide SiC. By means of varying the temperature of the thermal treatment of the fibers obtained from the sol-gel process, a variation in the crystal structures of the silicon carbide that are formed can thus be achieved.

Another possibility for influencing the properties of a carrier layer formed from fibers occurs if the fibers formed are interlinked with one another during subsequent treatment, in a renewed sol-gel process. In this way, a firm but nevertheless flexible composite of the fibers is formed from the individual fibers, by means of interlinking in the region of the contact points of individual fibers or a plurality of fibers, without the fibers having to be connected with one another by means of textile processing steps.

It is furthermore advantageous that the photovoltaic donor material can be applied to the carrier layers in a solution. In particular, if the layer thickness during deposition onto the carrier layer can be controlled by means of the degree of dilution in the solution of the photovoltaic donor material, it is possible to achieve an easy way of influencing the photovoltaic properties of the photovoltaic device formed from the carrier layers and the donor material, in terms of process technology.

Another improvement can be achieved if, at layer thicknesses of the acceptor material of more than 100 nm, fullerenes, carbon nanotubes, TiO2 nanocrystals, or SiC nanocrystals are additionally embedded into the acceptor material, which, in addition to the acceptor material, prevent recombination of the excitons, and bind them to themselves.

The invention furthermore describes a method for the production of a layer structure for a photovoltaic device, in which at least one of the two carrier layers is wetted or saturated with the liquid donor material, and, in the still liquid state of the donor material, is brought into contact with the other carrier layer, so that it touches it over an area, at least in sections, whereby the two carrier layers are permanently fixed in place on one another, touching one another at least in sections, as the result of hardening of the liquid donor material. In this way, a firm connection between the at least two carrier layers can be achieved, at the same time, by means of the saturation or wetting of the carrier layers with the donor material; after hardening of the donor material, which is preferably configured as a conjugated polymer, these layers are firmly fixed in place on one another.

A particularly preferred embodiment of the photovoltaic device according to the invention is shown in the drawing.

This shows.

Figure 1A:
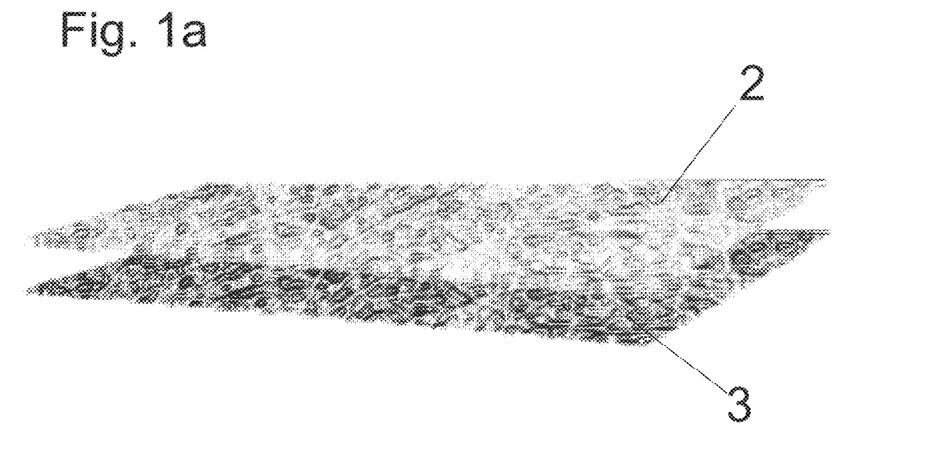
FIG. 1a-1c—a schematic representation of the sequence of production of the layer structure of a photovoltaic device according to the invention, FIG. 2a-2c-detail enlargements in the contact region of two fibers of the carrier layers of a photovoltaic device according to the invention, in accordance with FIG. 1, FIG. 3a-3d-photovoltaic processes in a photovoltaic device structured according to the invention, in accordance with FIG. 1, when light is being radiated in, FIG. 4—an enlarged representation of an arrangement of SiC fibers as pre-products for a carrier layer, FIG. 5—an enlarged representation of a subsequently treated arrangement of SiC fibers with interlinking locations at fiber intersections, FIG. 6—a schematic representation of the cross-section through an arrangement of carrier elements of a carrier layers formed from intersecting fibers, according to a second embodiment.
Figure 1B:
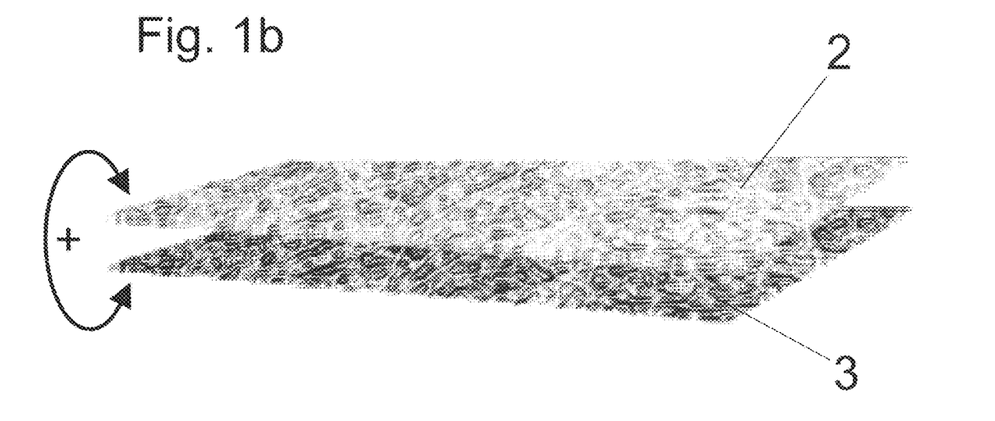
Figure 1C:
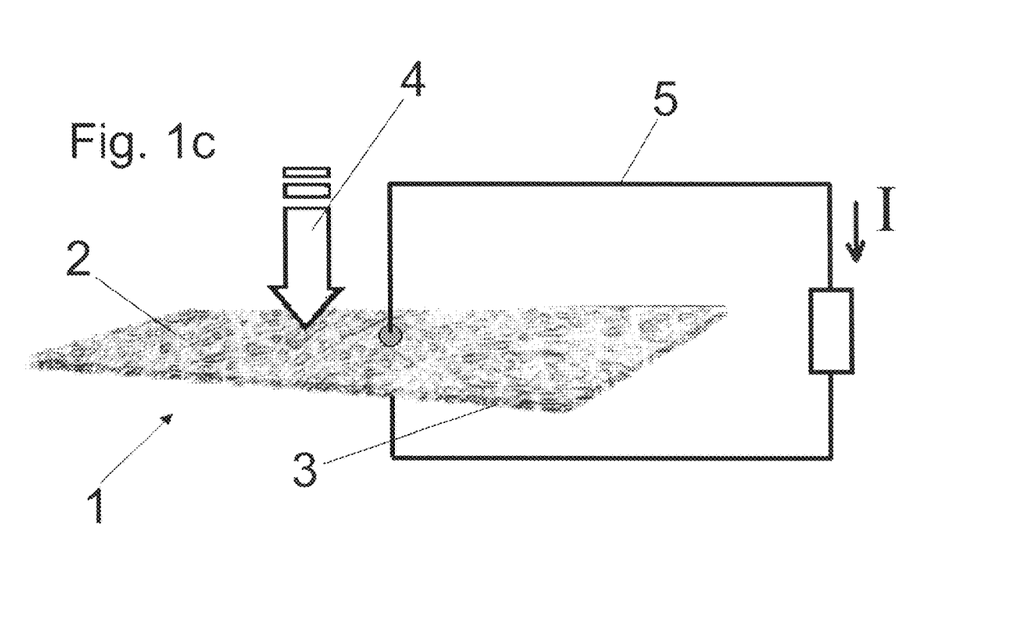

The sequence of production of the layer structure of a photovoltaic device 1 according to the invention is shown in FIGS. 1a to 1c; this device is formed from two carrier layers 2, 3 composed of silicon carbide fibers (SiC) having different dopings. For this purpose, as will be explained in greater detail below, carrier layers 2, 3 are produced from SiC fibers; in these layers, the fibers are present as a structure in the manner of a nonwoven fabric, for example, whereby the fibers touch at a plurality of points, and therefore the carrier layers 2, 3 have a corresponding strength. In this connection, one of the carrier layers 2 is configured as an electron acceptor, while the other carrier layer 3 is n-doped or also undoped, and configured as an electrode. The fibers composed of SiC are given the corresponding doping during a sol-gel process, after which the fibers are formed from the gel, under thermal reduction, and the doping materials are embedded during crystal growth of the fibers, which are preferably monocrystalline.

Because of the different doping of the two carrier layers 2, 3, a photovoltaic device 1 can be built up, together with a donor material 10 configured as a conjugated polymer here, for which purpose the donor material 10, sheathing the p-doped carrier layer 2, is introduced between the two carrier layers 2, 3. For this purpose, either the carrier layers 2, 3, which are disposed on top of one another, can be saturated with the donor material 10, thereby causing the donor material 10 to accumulate on the fibers 6, 7 of the two different carrier layers 2, 3, and thus a photovoltaic element is formed at the contact points of donor material 10 and p-doped or undoped fibers 7. Another method of procedure consists in wetting each of the two carrier layers 2, 3 with the donor material 10, so that the fibers 6, 7 of the carrier layers 2, 3 are sheathed by the donor material 10. In the still damp state of the usually liquid donor material 10, the carrier layers 2, 3 are then placed on top of one another and pressed together with one another, causing the fibers 6, 7 of the different carrier layers 2, 3 to lie on top of one another at certain points, with the interposition of the donor material 10. After the donor material 10 has hardened, the two carrier layers 2, 3 are then permanently fixed on top of one another, and can be handled as a unit.

If contacting towards the outside is now connected to the two carrier layers 2, 3, the voltage formed in the photovoltaic device 1 can be taken away.

Figure 2A:
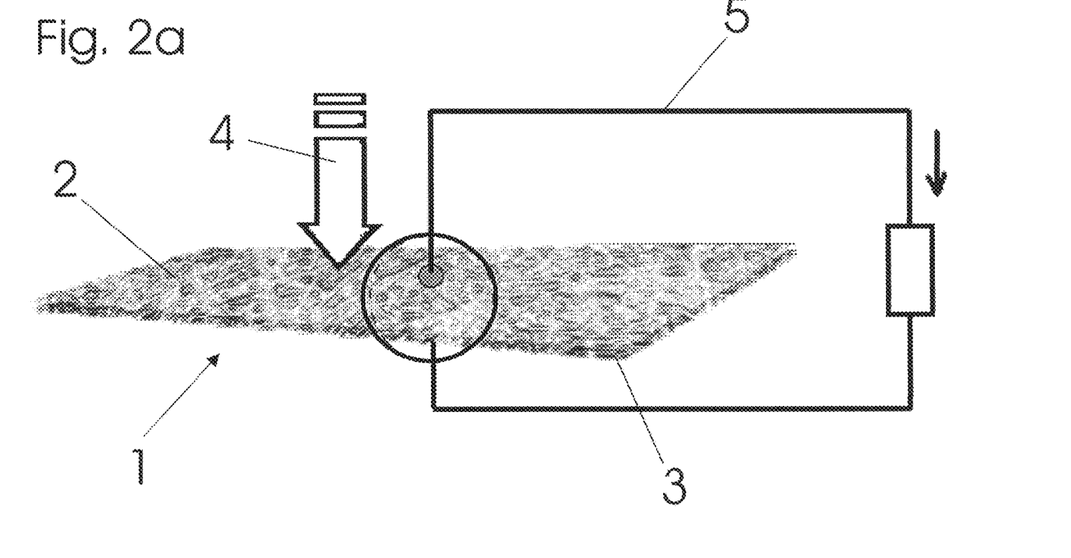
Figure 2B:
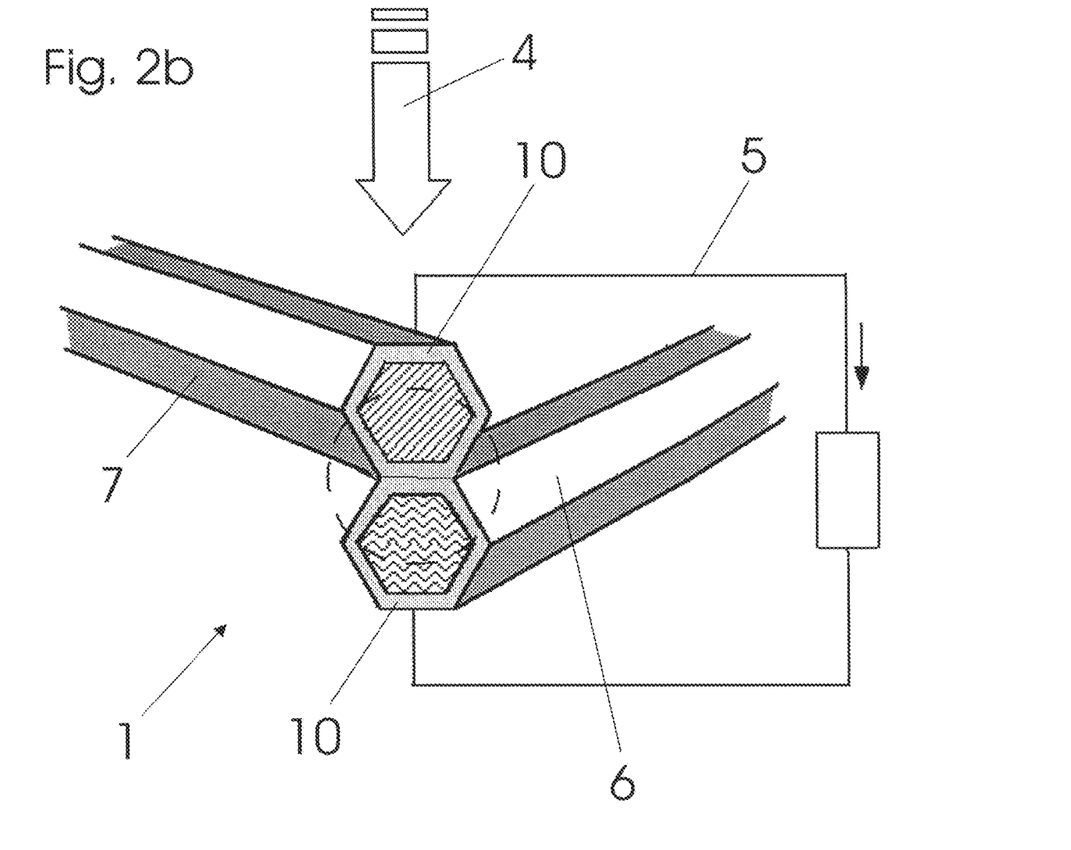
Figure 2C:
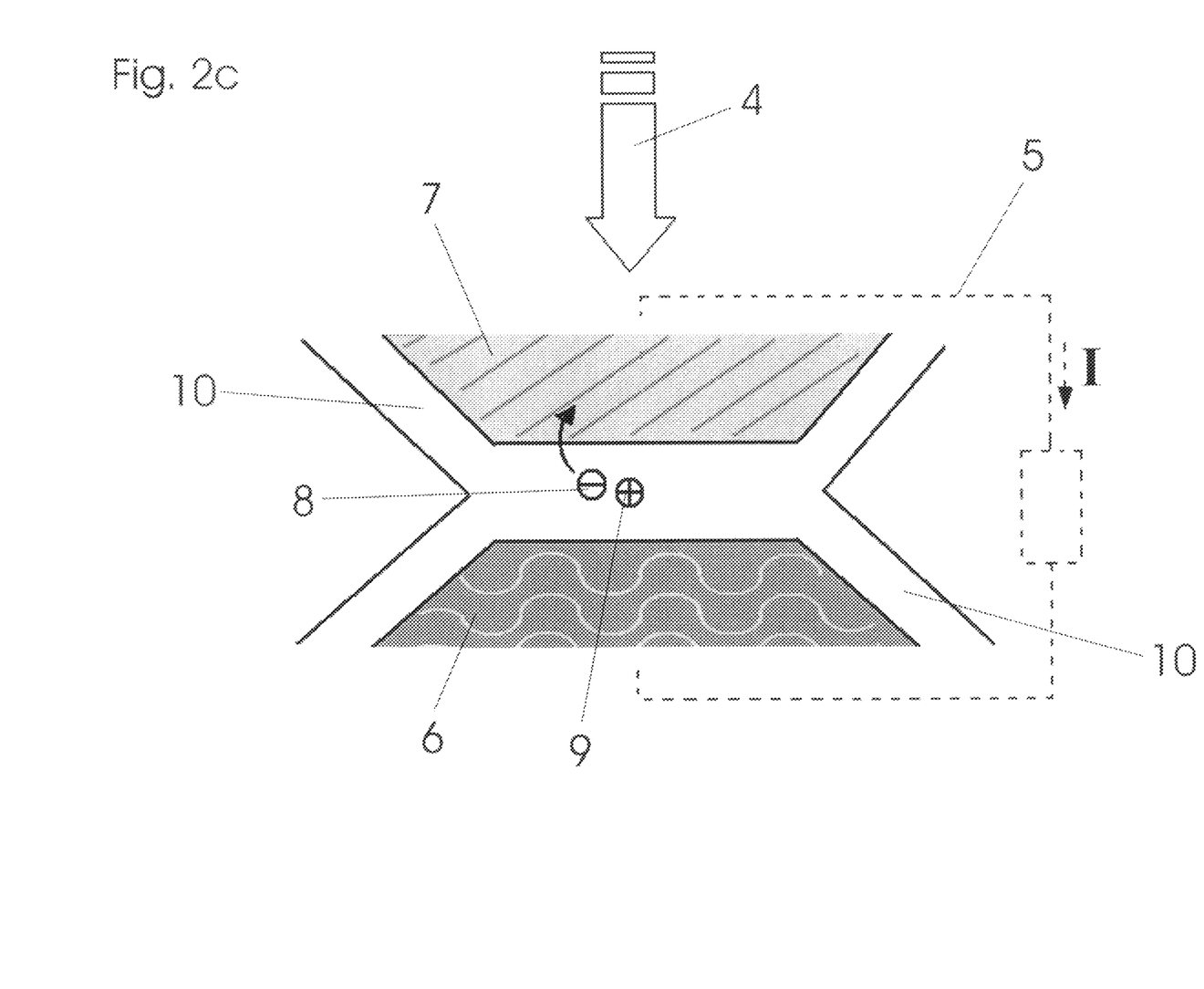
Figure 3A:
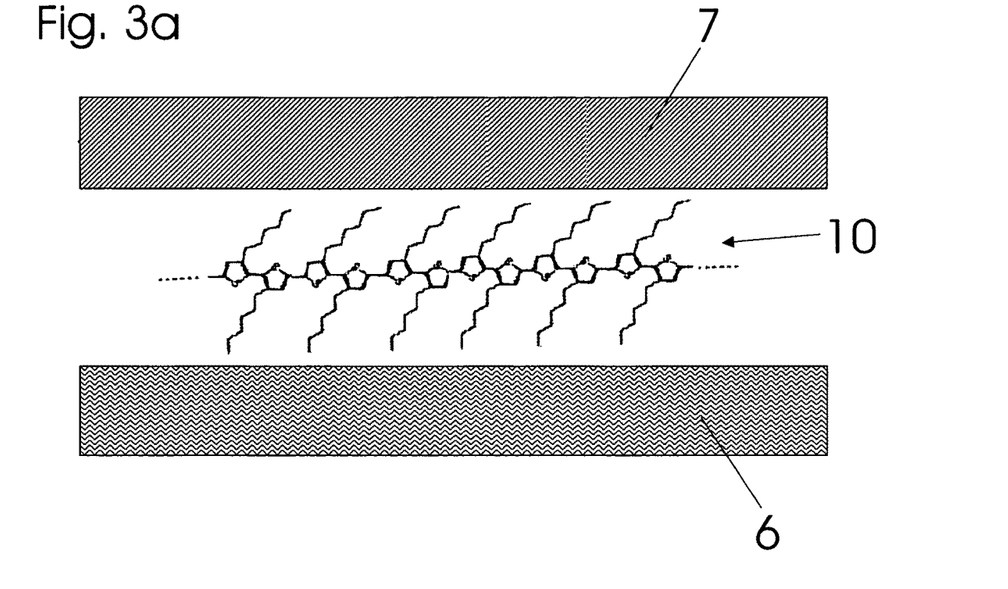
Figure 3B:
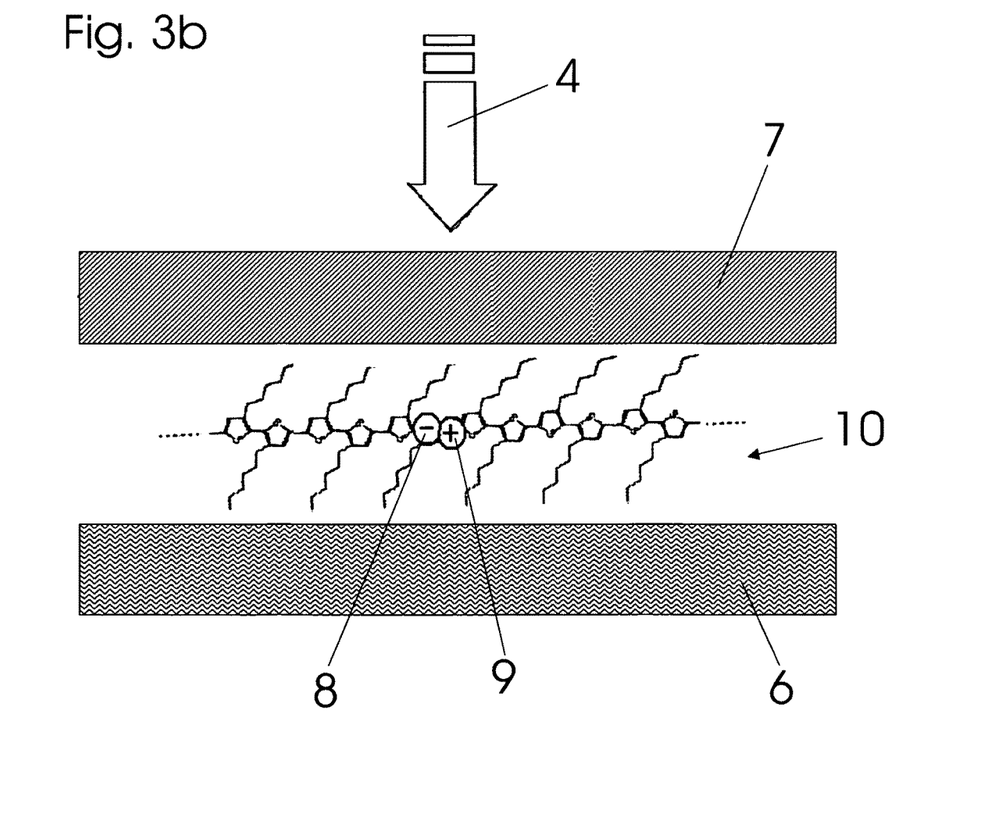
Figure 3C:
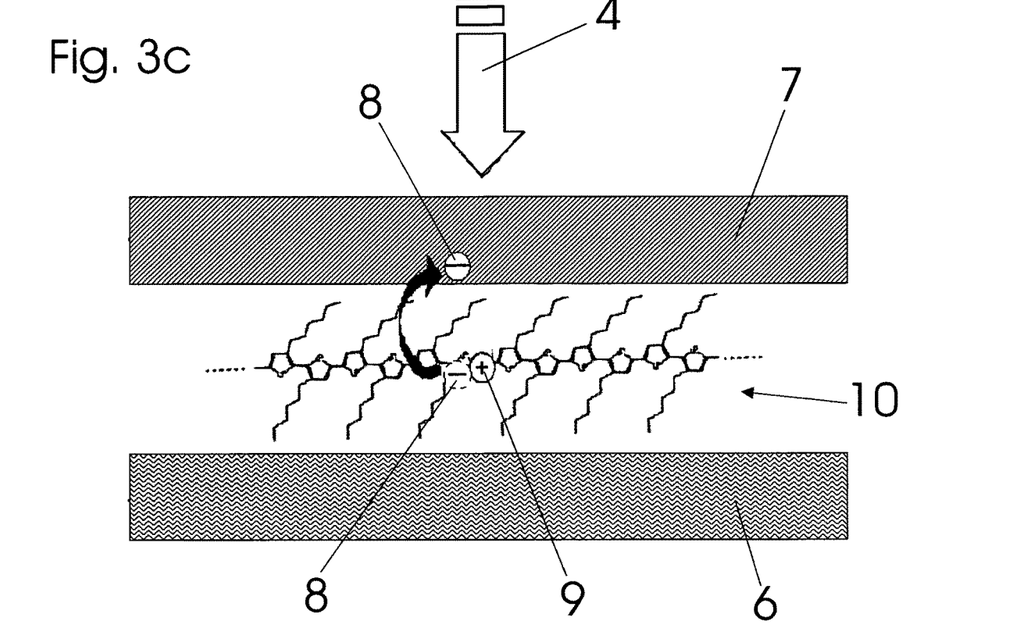
Figure 3D:
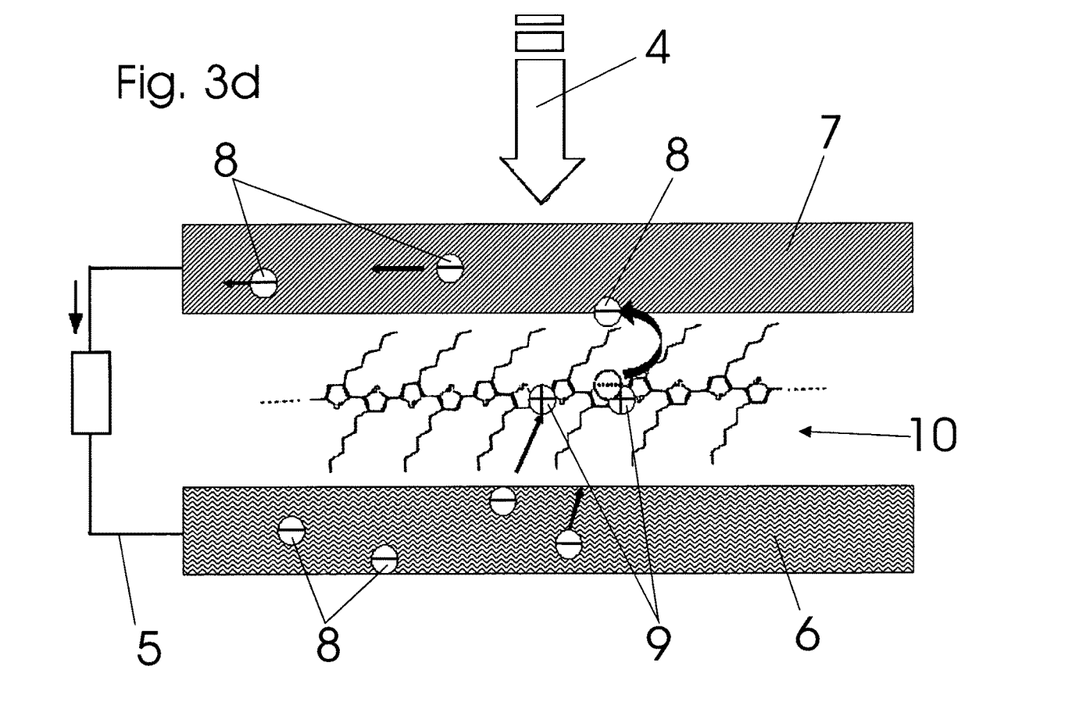

The processes that occur at the contact points of the fibers 6, 7 of the different carrier layers 2, 3 are now shown in FIGS. 2a to 2c, in detail enlargements. FIG. 2a corresponds to FIG. 1c, and is only included once again for the sake of a better overview. In the contact zone of the two carrier layers 2, 3, individual contacts of the fibers 6, 7 of the two carrier layers 2, 3 take place, as shown in FIG. 2b. In this connection, the SiC fiber 7 of the upper carrier layer 2 lies on the SiC fiber 6 of the lower carrier layer 3 at certain points, or over a small area, whereby the donor material 10, here in the form of a conjugated polymer, is disposed between the two fibers 6, 7 (FIG. 3a). If light 4 now falls onto the p-doped or undoped SiC fiber 6 that is sheathed with the donor material 10, then excitons (electron-hole pairs) are formed in the conjugated polymer 10, in known manner, as the result of the absorption of light 4, as is shown once again schematically in FIG. 3b. Because of the strong bond of the electron 8 to the polymer 10, the exciton has a relatively small diffusion length (distance of the electron 8 from the hole 9 remaining on the polymer chain) of about 100 nm, and recombines relatively rapidly. However, since the longest possible useful lifetime of the photo-induced state is advantageous for photovoltaic applications, an acceptor material, which is supposed to capture these electrons 8 in the diffusion region of the exciton, and thus prevent them from recombining, is required. This acceptor material, in the form of the p-doped SiC, is disposed at a distance from the location for formation of the exciton, which distance the electron 8 can overcome and thus make a transition into the acceptor material 7 (FIG. 3c). For this purpose, the layer thickness of the donor material 10 must be coordinated with the diffusion length of the exciton. The electron 8 passes over into the n-doped or undoped SiC material 6, thereby resulting in the circuit 5 shown in FIG. 3d.

Figure 4:
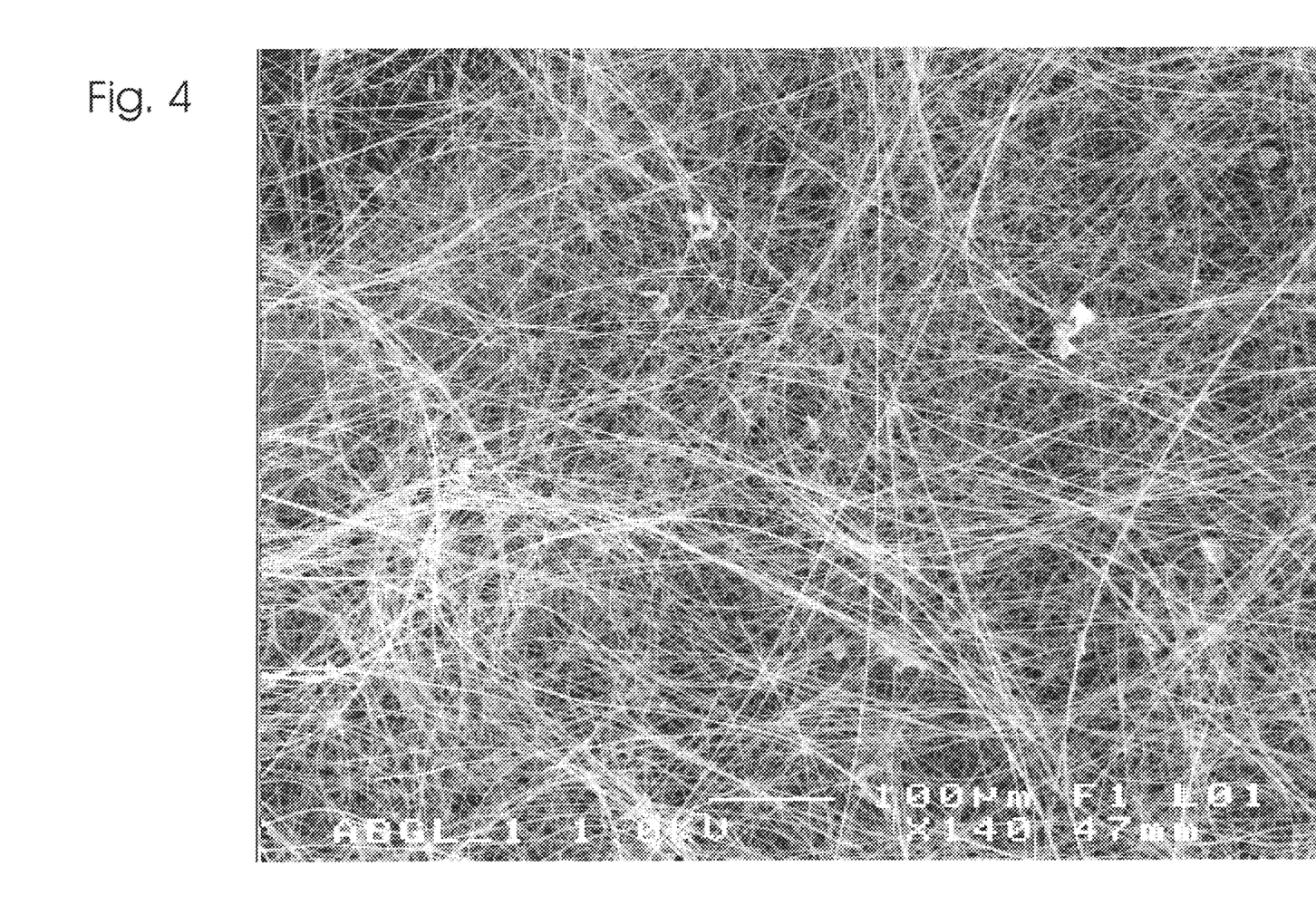
Figure 5:
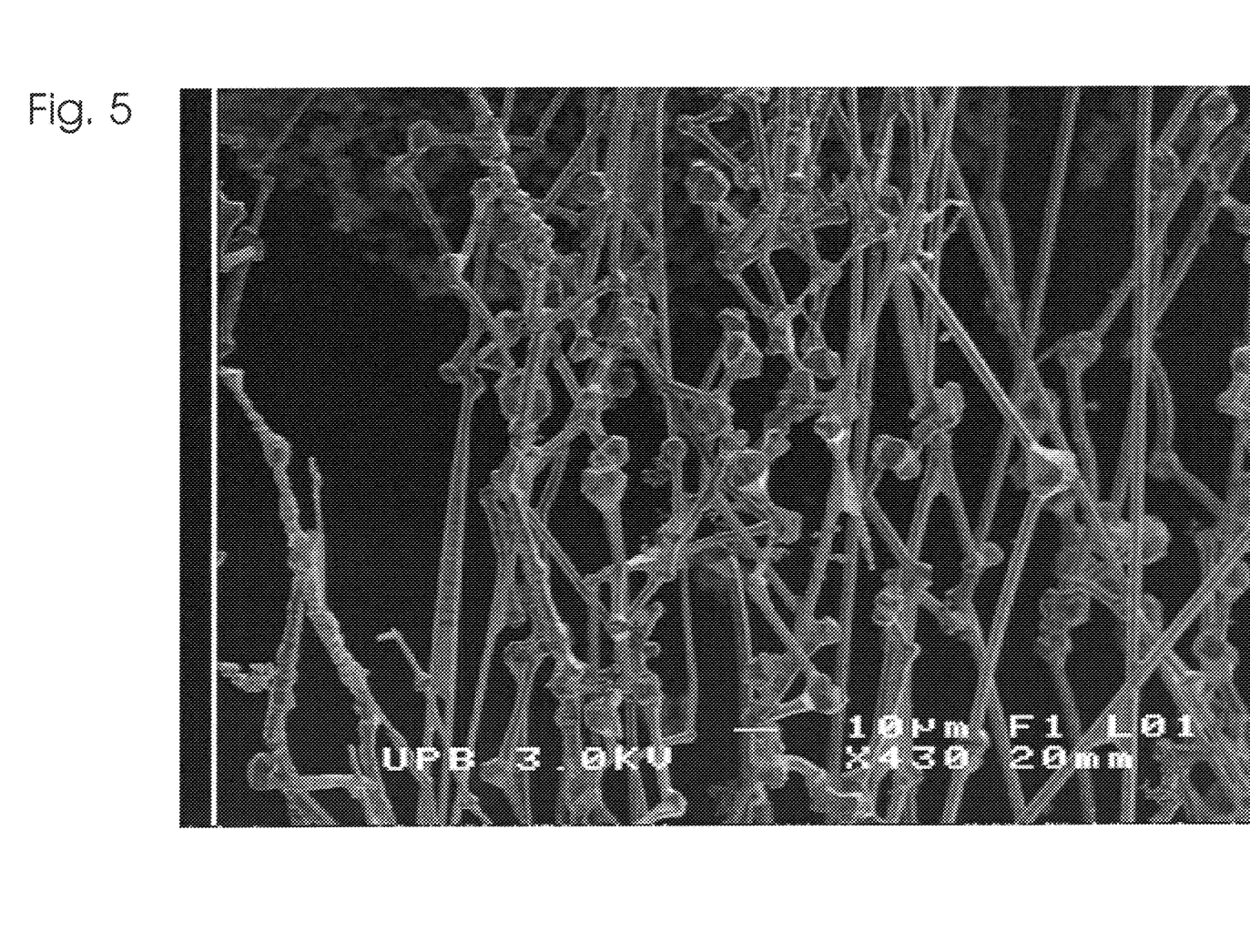

Examples for the structure of a carrier layer 2, 3 formed from fibers 6, 7 composed of SiC, in the form of an arrangement of the fibers 6, 7 in the manner of a nonwoven fabric, can be seen in FIGS. 4 and 5. Here, in a greatly enlarged view, a structure formed from short fibers 6, 7 can be seen in FIG. 4, in which structure the fibers 6, 7 are present like in a nonwoven fabric, oriented in different directions, as a kind of heaped structure, and thus are connected with one another only in relatively weak manner. Such fibers 6, 7 can be oriented and better fixed in place on one another by means of known textile processing methods. In this way, many different kinds of usage purposes of such carrier layers 2, 3 can be opened up, since a photovoltaic device 1 of the type according to the invention can always be provided, as well, wherever textile woven fabrics or structures are exposed to light 4.

In FIG. 5, in another enlarged representation, a different way of fixing the fibers 6, 7 of the carrier layers 2, 3 in place on one another can be seen, in which the fibers 6, 7 of a carrier layer 2, 3 are interlinked with one another at their contact points, by means of a subsequent additional sol-gel process, and thus the structure of the fibers 6, 7 is more firmly connected with one another. As a result, subsequent textile processing procedures of the fibers 6, 7 are made unnecessary, in whole or in part.

Figure 6:
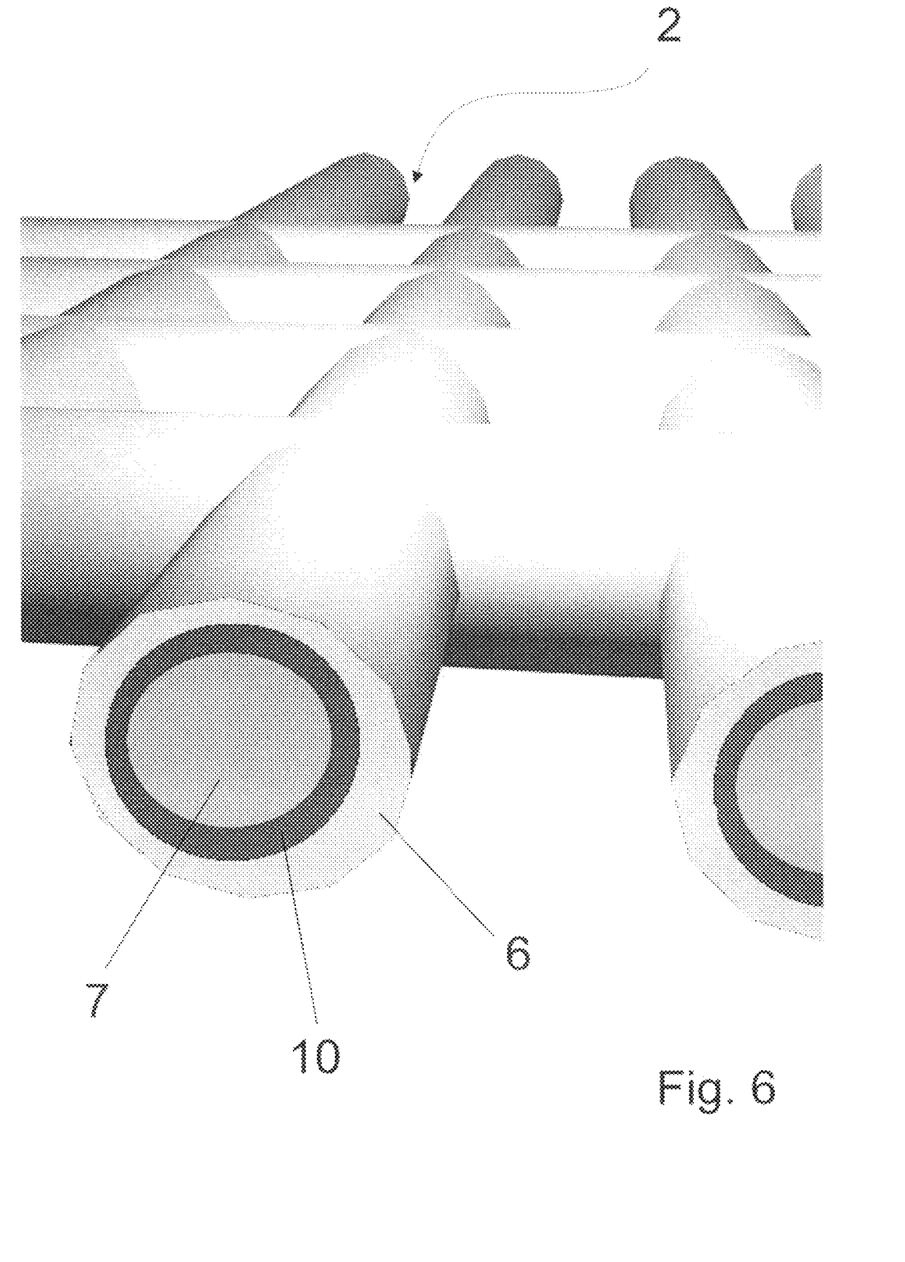

In FIG. 6, in a very schematic representation, the cross-section through an arrangement of carrier elements of a carrier layer 2 composed of intersecting fibers, in accordance with the second main embodiment, is shown, whereby the carrier layer 2 consists of a number of carrier elements composed of the acceptor material 7 and extending longitudinally, in fiber-like manner, and the carrier elements of the carrier layer 2 are wetted or coated with the photovoltaic donor material 10, in film-like manner. A further layer composed of an electron donor is applied to the layer having the photovoltaic donor material 10, whereby these three layers then form the photovoltaically effective arrangement already described, separately for each carrier element. In this connection, the precise adjustability of the layer thicknesses, in each instance, is particularly advantageous; as a result, the photovoltaic properties of the carrier elements can be controlled and optimized well, and become independent of the location of individual layers of the embodiment according to FIG. 1. In this connection, the carrier elements can assume intersecting arrangements, as shown in FIG. 6, but any other arrangement of the carrier elements relative to one another is also possible.

REFERENCE SYMBOL LIST

1—photovoltaic device
2—p-doped or undoped carrier layer
3—n-doped carrier layer
4—light
5—circuit
6—electrode
7—acceptor
8—electron
9—hole
10—donor/conjugated polymer

The invention claimed is:
1. A photovoltaic device comprising:
a network of coated fibers, wherein each coated fiber of said network of coated fibers comprises:
an optically transparent innermost fiber core consisting of a p-type silicon carbide (SiC) and being a first transparent semiconductor, wherein the first transparent semiconductor is a p-type electron acceptor, the optically transparent innermost fiber core withstanding mechanical stress and having mechanical flexibility;
a semiconductor coating comprising a conjugated polymer which is a second transparent semiconductor sheathing the optically transparent innermost fiber core and electrically connected to the optically transparent innermost fiber core, wherein the second transparent semiconductor is an n-type electron donor; and
at least one additional layer surrounding the semiconductor coating and electrically connected to the semiconductor coating, wherein the at least one additional layer comprises at least one at least semi-transparent electrical conducting material;
wherein the first transparent semiconductor and the second transparent semiconductor form a semiconductor p-n-junction;
wherein each of the coated fibers has a length of about 5 mm and a diameter between 20 nm and 100 μm;
wherein at least one of the components of the semiconductor p-n-junction comprises a photoactive material to create photoinduced excitons such that the semiconductor p-n-junction comprises a photovoltaic element having a photovoltaic effect between the optically transparent innermost fiber core consisting of the first transparent semiconductor and the semiconductor coating comprising the second transparent semiconductor; and
wherein each coated fiber of said network of coated fibers contacts at least one other coated fiber of said network of coated fibers so that the network of coated fibers comprises a two-dimensionally extended arrangement of multiple at least partially intersecting single coated fibers and so that the coated fibers are interlinked with each other; and
wherein the SiC is an electron acceptor in a hybrid polymer/SiC cell.

2. The photovoltaic device according to claim 1, wherein every optically transparent innermost fiber core is coated by the semiconductor coating.

3. The photovoltaic device according to claim 1, wherein the effectiveness of the photoinduced exciton creation is at least correlated with a thickness of the said semiconductor coating.

4. The photovoltaic device according to claim 1, wherein the said additional layer comprises a transparent or translucent organic conductor as an electrode material.

5. The photovoltaic device according to claim 4, wherein the organic conductor has been deposited from solution or suspension via spin-coating, dip-coating, printing, or spraying.

6. The photovoltaic device according to claim 1, wherein the second transparent semiconductor forming the semiconductor coating has been applied from solution or suspension via spin-coating, dip-coating, printing or spraying.

7. The photovoltaic device according to claim 6, wherein a thickness of the semiconductor coating is controlled by degree of dilution of a solution during deposition.

8. The photovoltaic device according to claim 1, wherein the network of coated fibers is processed as a textile and forms a coated ceramic textile.

9. The photovoltaic device according to claim 8, wherein the single coated fibers are arranged into a non-woven fabric.

10. The photovoltaic device according to claim 8, wherein the single coated fibers are arranged into a woven fabric.

11. The photovoltaic device according to claim 8, further comprising electronic components.

12. The photovoltaic device according to claim 1, wherein the network of coated fibers forms a flexible, bendable composite.

13. The photovoltaic device according to claim 1, wherein the optically transparent innermost fiber cores comprise monocrystalline silicon carbide (SiC).

14. The photovoltaic device according to claim 13, wherein the optically transparent innermost fiber cores have a hexagonally-shaped cross-section.

15. The photovoltaic device according to claim, wherein the optically transparent innermost fiber cores comprise polycrystalline silicon carbide (SiC).

16. The photovoltaic device according to claim 1, wherein the second transparent semiconductor is a photoactive conjugated polymer.

17. The photovoltaic device according to claim 16, wherein the photoactive conjugated polymer is selected from the group consisting of P3AT (poly(3-alkylthiophene)), MDMO-PPV (poly(2-methoxy-5-(3=,7=-dimethyl octyloxy)-1,4-phenylene vinylene)), and PFB (poly(9,9=-dioctyl fluorine-co-bis-N,N=-(4-butyl phenyl)-bis-N,N=-phenyl-1, 4-phenylene diamine)).

18. The photovoltaic device according to claim 1, wherein the said additional layer surrounding the semiconductor coating comprises an at least semi-transparent selective charge-blocking layer and/or terminal environmental protection layer.

* * * * *